US011038327B2

(12) United States Patent
Wang et al.

(10) Patent No.: US 11,038,327 B2
(45) Date of Patent: Jun. 15, 2021

(54) INVERTER BOX STRUCTURE

(71) Applicant: Delta Electronics, Inc., Taoyuan (CN)

(72) Inventors: Xiangwei Wang, Taoyuan (CN); Jie Zhang, Taoyuan (CN)

(73) Assignee: Delta Electronics, Inc., Taoyuan (TW)

( * ) Notice: Subject to any disclaimer, the term of this patent is extended or adjusted under 35 U.S.C. 154(b) by 21 days.

(21) Appl. No.: 16/508,454

(22) Filed: Jul. 11, 2019

(65) Prior Publication Data

US 2020/0083685 A1  Mar. 12, 2020

(30) Foreign Application Priority Data

Sep. 7, 2018  (CN) .......................... 201821462867.9

(51) Int. Cl.
*H02G 3/08* (2006.01)
*H01R 25/00* (2006.01)
*H05K 7/14* (2006.01)
*H02M 7/00* (2006.01)

(52) U.S. Cl.
CPC .......... *H02G 3/083* (2013.01); *H01R 25/006* (2013.01); *H02M 7/003* (2013.01); *H05K 7/1427* (2013.01)

(58) Field of Classification Search
None
See application file for complete search history.

(56) References Cited

U.S. PATENT DOCUMENTS

| 7,105,742 | B1 * | 9/2006 | Jolly ...................... H02G 3/123 174/50 |
| 7,214,875 | B1 * | 5/2007 | Gretz ..................... H02G 3/086 174/481 |
| 8,441,160 | B2 * | 5/2013 | Watanabe ............. F04C 29/063 310/71 |
| 2017/0373635 | A1 * | 12/2017 | Perez ..................... H02S 40/32 |

FOREIGN PATENT DOCUMENTS

| CN | 104167984 A | 11/2014 | |
| CN | 205755139 U | 11/2016 | |
| EP | 3059823 A1 * | 8/2016 | ............. H02G 3/121 |

\* cited by examiner

*Primary Examiner* — James Wu
*Assistant Examiner* — Christopher L Augustin
(74) *Attorney, Agent, or Firm* — Qinghong Xu (57) ABSTRACT

An inverter box structure includes an inverter accommodating box of an inverter circuit and a junction box. A first quick connector, disposed on the inverter accommodating box, includes a first connection end and a second connection end. The first connection end of the first quick connector is electrically with the inverter circuit. A second quick connector, disposed on the junction box or in the junction box, includes a third connection end and a fourth connection end. The third connection end of the second quick connector is connected to an inner wire of the junction box. A casing of the inverter accommodating box equipped with the first quick connector is opposite to a casing of the junction box equipped with the second quick connector, and the second connection end of the first quick connector matches with and is electrically connected to the fourth connection end of the second quick connector.

11 Claims, 7 Drawing Sheets

INVERTER BOX STRUCTURE

CROSS REFERENCE

This application is based upon and claims the benefit of priority of Chinese Patent Applications No. 201821462867.9, filed on Sep. 7, 2018, the entire contents thereof are incorporated herein by reference.

TECHNICAL FIELD

The present disclosure relates to the field of power supply and distribution technology, specifically to an inverter box structure.

BACKGROUND

Figure 1:
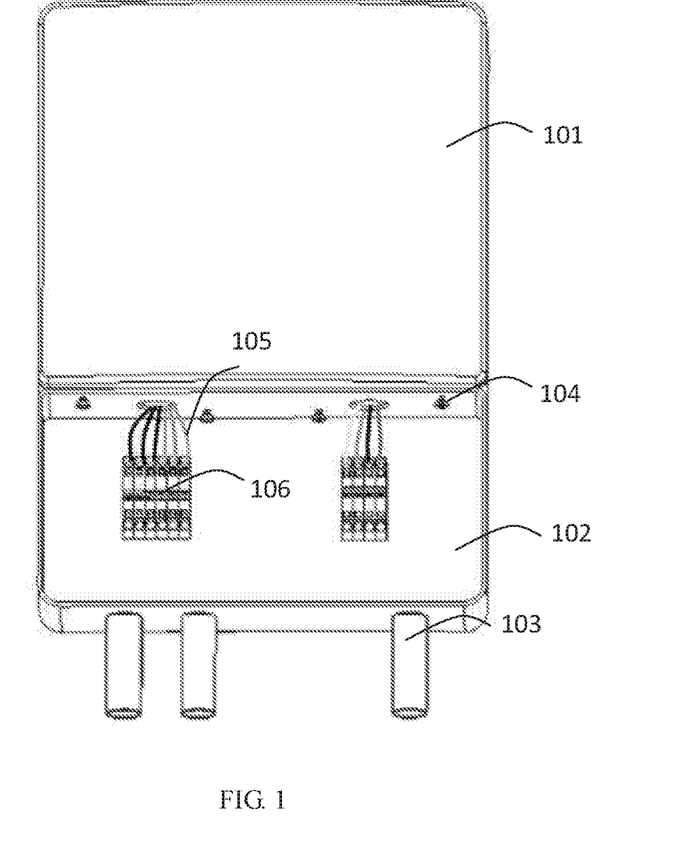
FIG. 1 shows a schematic view of an inverter box mechanical structure of the prior art.

A photovoltaic inverter converts variable DC power generated by a photovoltaic solar panel into AC power, such that the AC power can be transmitted to commercial power supply system or be applied to off-grid local electrical load. As shown in FIG. 1, FIG. 1 shows a schematic view of a photovoltaic inverter box mechanical structure of the prior art. The photovoltaic inverter box structure comprises an inverter accommodating box 101 for disposing an inverter and a junction box 102. A through hole is arranged between the junction box 102 and the inverter accommodating box 101, such that wires 105 of the inverter accommodating box 101 can be guided into the junction box 102 and connected to a corresponding connection terminal 106 through the through hole. When the inverter box is applied to a specific place, the external wires are connected to corresponding connection terminal 106 of the junction box 102 through a wire guiding tube 103, so as to achieve connection between inner wires of the inverter and wires of external equipment. Furthermore, the side walls of the junction box and the inverter accommodating box are fixed together by screws or bolts. Since the screws 104 are vertically locked at the side wall, it cannot be operated from the front with a common screwdriver, so a screwdriver or wrench with 90 degree is needed, which is inconvenient for maintenance. Especially, when the inverter has a breakdown and needs to be sent back and repaired, the wires of the inverter accommodating box 101 need to be detached from the connection terminal 106 one by one and the inverter accommodating box 101 needs to be detached from the junction box. After repairing, the new inverter accommodating box 101 needs to be connected and fixed to the junction box again and the wires of the inverter accommodating box need to be connected to the connection terminal 106 one by one again.

In the prior art, it is very inconvenient to assemble and disassemble the inverter accommodating box and the junction box of the inverter box structure and there is no fool-proofing function for each wire. An operator may connect wires according to a cable mark only, which may be easy for the operator to make a mistake when connecting wires. It is dangerous and consumes much time and manpower. Accordingly, it will not only increase cost of assembly and maintenance but also increase the risk of misconnection.

SUMMARY

In the light of the problems of the prior art, an objective of the present disclosure is to provide an inverter box structure to solve the problems of the prior art, so as to improve convenience of assembly and disassembly and reduce cost of assembly and maintenance.

The features and advantages of the present disclosure will be obvious by the detailed description in the following or be taught by implementing the present disclosure.

According to one embodiment of the present disclosure, an inverter box structure comprises an inverter accommodating box of an inverter circuit and a junction box. A first quick connector is disposed on the inverter accommodating box. The first quick connector comprises a first connection end and a second connection end. The first connection end of the first quick connector is electrically coupled with the inverter circuit. A second quick connector is disposed on the junction box or in the junction box. The second quick connector comprises a third connection end and a fourth connection end. The third connection end of the second quick connector is connected to inner wires of the junction box. A casing of the inverter accommodating box equipped with the first quick connector is opposite to a casing of the junction box equipped with the second quick connector, and the second connection end of the first quick connector matches with and is electrically connected to the fourth connection end of the second quick connector.

The detailed description and drawings below are used to describe the features of the present disclosure. However, the detailed description and drawings below are used for illustration purpose only and the present disclosure is not so limited.

BRIEF DESCRIPTION OF THE DRAWINGS

Embodiments of the present disclosure will now be described, by way of example only, with reference to the accompanying schematic drawings in which corresponding reference symbols indicate corresponding parts, and in which.

DETAILED DESCRIPTION

In the following, embodiments of the present disclosure will be described in detail referring to figures. The concept and its realizations of the present disclosure can be implemented in a plurality of forms, and should not be understood to be limited to the embodiments described hereafter. In contrary, these embodiments are provided to make the present disclosure more comprehensive and understandable, and so the conception of the embodiments can be conveyed to the technicians in the art fully. Same reference signs in the figures refer to same or similar structures, so repeated description of them will be omitted.

The features, structures or characteristics described can be combined in any appropriate way in one or more embodiments. In the description below, many specific details are provided to explain the embodiments of the present disclosure fully. However, the technicians in the art should realize that, without one or more of the specific details, or adopting other methods, components, materials etc., the technical proposal of the present disclosure can still be realized. In certain conditions, structures, materials or operations well known are not shown or described in detail so as not to obfuscate the present disclosure.

Figure 2:
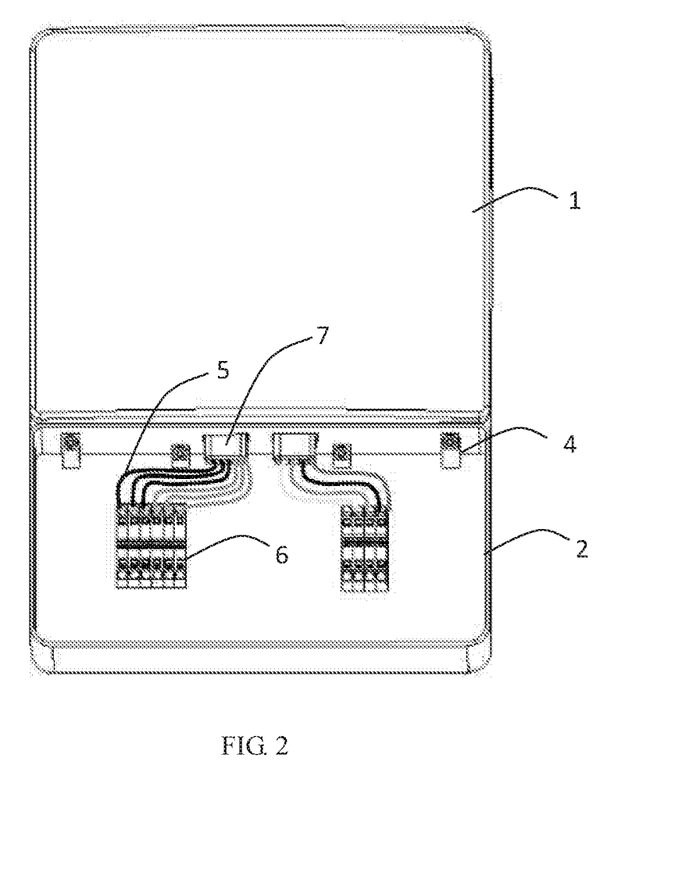
FIG. 2 shows a schematic view of an inverter box mechanical structure of one embodiment of the present disclosure.
Figure 3:
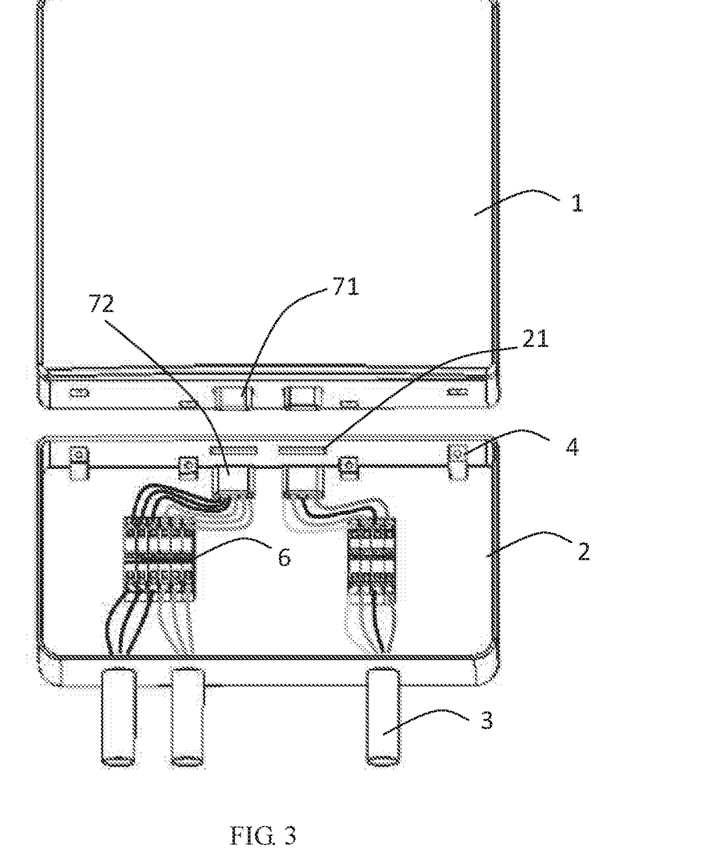
FIG. 3 shows a schematic view of an inverter box mechanical structure of one embodiment of the present disclosure, wherein the junction box and the inverter accommodating box are detached from each other.
Figure 4:
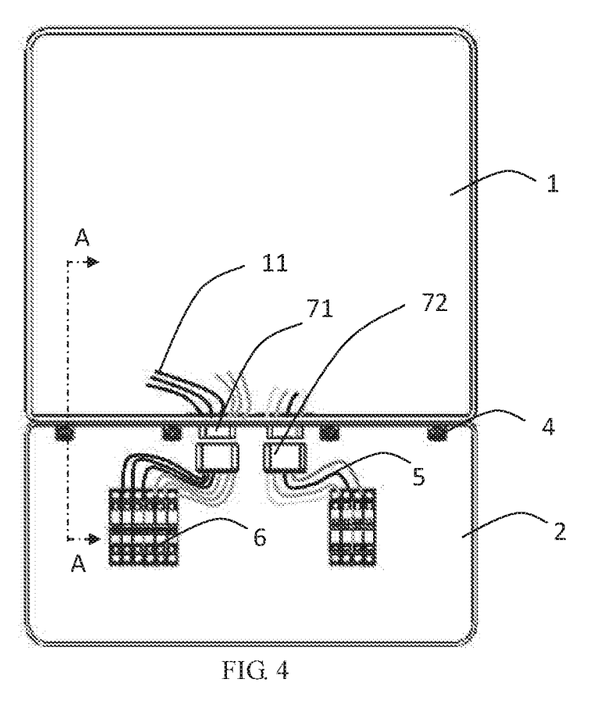
FIG. 4 shows a schematic view of inner wires of an inverter box structure of one embodiment of the present disclosure.

One embodiment of the present disclosure provides an inverter box structure. As shown in FIG. 2-4, the inverter box structure comprises an inverter accommodating box 1 of an inverter circuit and a junction box 2, a casing of the inverter accommodating box 1 is connected to a casing of the junction box 2, and outlet wires 11 of the inverter circuit in the inverter accommodating box 1 is electrically connected to an inner wire 5 of the junction box 2.

In this embodiment, in order to improve convenience of wire connection and disconnection between the inverter accommodating box 1 and the junction box 2, the outlet wires 11 of the inverter circuit and the inner wires 5 of the junction box 2 are connected to each other by a quick connector 7. Specifically, a first quick connector 71 is disposed on the inverter accommodating box 1 and a second quick connector 72 is disposed on the junction box 2 or in the junction box 2. The first quick connector 71 comprises a first connection end and a second connection end. The second quick connector 72 comprises a third connection end and a fourth connection end. The first connection end of the first quick connector 71 is connected to the outlet wires 11 of the inverter circuit. The third connection end of the second quick connector 72 is connected to the inner wires 5 of the junction box 2. The second connection end of the first quick connector 71 matches with and is electrically connected to the fourth connection end of the second quick connector 72, such that the outlet wires 11 of the inverter circuit is electrically connected to the inner wires 5 of the junction box 2. The aforesaid term "match" means that the number of terminals of the second connection ends of the first quick connector 71 is identical to and corresponds to the number of terminals of the fourth connection ends of the second quick connector 72.

Figure 5:
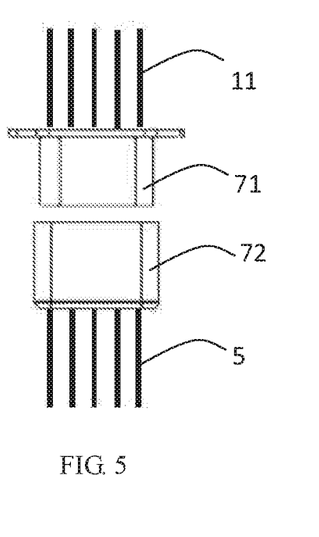
FIG. 5 shows a schematic view of quick connectors of one embodiment of the present disclosure.

The quick connector can be pluggable connector. As shown in FIG. 5, in general, the quick connector includes a male connector and a female connector. The male connector is connected with the female connector to achieve electrical connection between both. By means of the quick connector, an operator can plug and unplug the quick connector conveniently while assembling and disassembling the inverter and need not to plug/unplug the wire into/from the connection terminal 6 one by one. Accordingly, the present disclosure improves convenience of assembly and disassembly, reduce consumption of manpower and material resources, and reduce cost of assembly and maintenance. Moreover, since the connection between the male connector and the female connector and their respective inner wires is connected in advance and remains unchanged, an operator only needs to align and insert the male connector and the female connector with each other, and need not to find corresponding terminal for each wire. Accordingly, the present disclosure can achieve the fool-proofing function and avoid breakdown or danger due to misconnection of the wire.

In this embodiment, the first quick connector 71 is a male connector and the second connection end of the first quick connector 71 protrudes from the inverter accommodating box 1. The second quick connector 72 is a female connector. When assembling the inverter accommodating box 1 and the junction box 2, the first quick connector 71 is inserted into the second quick connector 72. In another embodiment, the first quick connector 71 may be a female connector, the second quick connector 72 may be a male connector, the fourth connection end of the second quick connector 72 protrudes from the junction box 2, and the second quick connector 72 is inserted into the first quick connector 71.

Wherein, the second quick connector 72 is fixed on the casing of the junction box 2 or disposed in the junction box 2. As shown in FIG. 3, in this embodiment, the second quick connector 72 is disposed in the junction box 2 and the casing of the junction box 2 has an opening 21 corresponding to the first quick connector 71 of the inverter accommodating box 1. As shown in FIG. 4, the second connection end of the first quick connector 71 passes through the opening 21 to be electrically connected to the fourth connection end of the second quick connector 72 in the junction box 2. The first quick connector 71 can be embedded with the second quick connector 72 after the second quick connector 72 being aligned with the opening 21 in the function box 2. When the first quick connector 71 and the second quick connector 72 are separated from each other, the second quick connector 72 can be placed in the junction box 2 conveniently, and the inner wires 5 will not be messy.

In this embodiment, a connection terminal 6 is further disposed in the junction box 2. An end of the connection terminal 6 and the second quick connector 72 are electrically connected to each other through the inner wires 5. Another end of the connection terminal 6 is connected to external equipment through wires by a wire guiding tube 3. The inner structure of the junction box 2 depicted herein is only for illustration purpose and the present disclosure is not so limited. The present disclosure, in some embodiments, adopts other connecting structures and those still belong to the scope of the claimed invention.

In order to fix the inverter accommodating box 1 with the junction box 2 much well, in this embodiment, at least one fastener is further provided between the casing of the inverter accommodating box 1 and the casing of the junction box 2, so as to connect both tightly. The fastener includes a bolt, a screw, a rivet, or the like.

Figure 6:
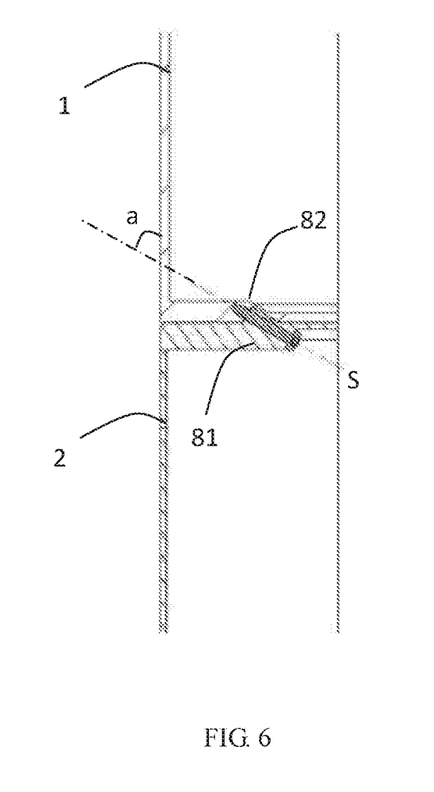
FIG. 6 shows a sectional view of FIG. 4 along direction A-A.
Figure 7:
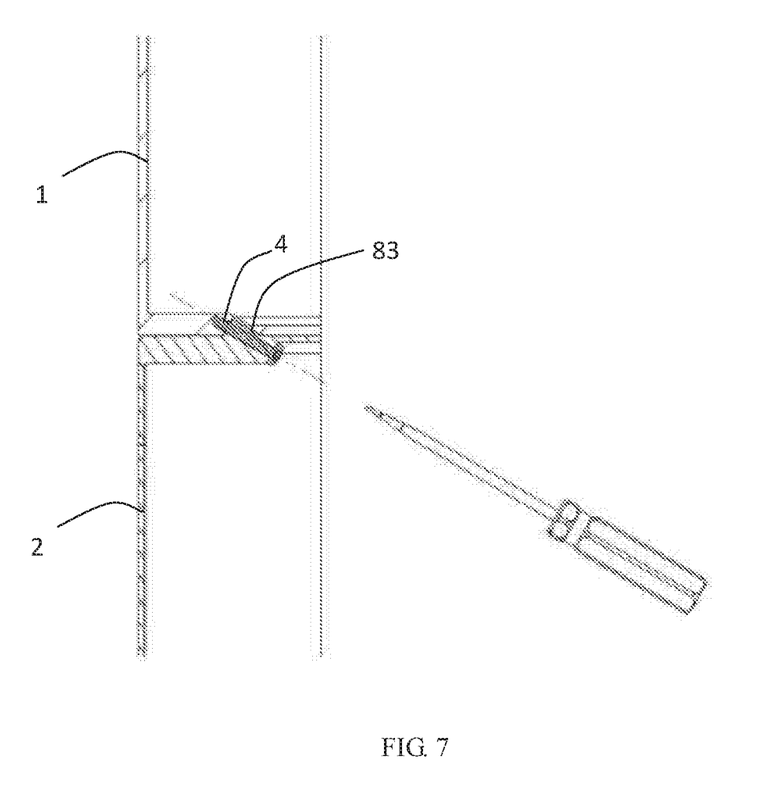
FIG. 7 shows a schematic view of the assembly of the screw shown in FIG. 6.

FIG. 6-7 show the assembly of the screw according to one embodiment of the present disclosure, wherein FIG. 6 is a sectional view alone direction A-A of FIG. 4. The fixing manner between the casing of the inverter accommodating box 1 and the casing of the junction box 2 is shown.

In this embodiment, the screw 4 is used to be the fastener for example. Needless to say, the screw 4 is replaced by other fasteners.

A first screw hole corresponding to the screw 4 is arranged on the casing of the junction box 2. A second screw hole corresponding to the first screw hole is arranged on the casing of the inverter accommodating box 1. The first screw hole and the second screw hole are coaxial and through, wherein the axis S shown in the figure is the central axis. An inner thread of the first screw hole and an inner thread of the second screw hole both match with an outer thread of the screw 4. The screw 4 is screwed into the first screw hole and the second screw hole, so as to fix the casing of the inverter accommodating box 1 with the casing of the junction box 2.

In this embodiment, for the operator to assemble and disassemble the screw conveniently, the central axis S of the first screw hole and the second screw hole is tilt relative to a bottom surface of the junction box 2 by an angle a. As shown in FIG. 7, when assembling the screw 4, the operator tilts a common screwdriver with a specific angle, so as to install the screw 4 to a desired position easily.

In some embodiments, the angle "a" is greater than 50 degree and less than 70 degree. In some embodiments, the angle is chosen 60 degree. In practical applications, an angle beyond the range is used and that still belongs to the scope of the claimed invention. When the angle a is equal to 60 degrees, the operator only needs to tilt the screwdriver with 30 degrees relative to the horizontal plane, such that a common screwdriver is used to assemble the screw conveniently. Furthermore, as shown in FIG. 7, a force (i.e. F*cos 60°=F/2) will be generated in upper and lower direction between junction box and inverter accommodating box while the screw is being fixed, wherein F represents a tight force of the screw. The junction box 2 and the inverter accommodating box 1, in some embodiments, abut against each other tightly through the force, so as to compress a seal ring between the casing of the junction box 2 and the casing of the inverter accommodating box 1 tightly and then ensure the sealing capability therebetween.

In this embodiment, a first protruding portion 81 is disposed at an inner surface of the casing of the junction box 2, the first screw hole is formed on the first protruding portion 81, and an end surface of the first screw hole is perpendicular to the central axis S of the first screw hole. A first recess portion 82 is disposed at an outer surface of the casing of the inverter accommodating box 1, the second screw hole is formed on the first recess portion 82, and an end surface of each second screw hole is perpendicular to a central axis of the second screw hole. Furthermore, a second protruding portion 83 is disposed at an outer surface of the casing of the junction box 2, the second protruding portion 83 corresponds to and matches with the first recess portion 82 of the outer surface of the casing of the inverter accommodating box 1, and the second protruding portion 83 is embedded in the first recess portion 82, such that the screw 4 is locked in the first screw hole and the second screw hole to the connect and fix the inverter accommodating box and the junction box. In this embodiment, the shape of the first recess portion 82 matches with the shape of the second protruding portion 83.

The number of the first protruding portions 81, the first recess portions 82, and the second protruding portions 83 are determined according to practical applications. For example, the junction box 2 is provided with one first protruding portion 81, and a plurality of first screw holes are formed on the first protruding portion 81 or, alternatively, the junction box 2 is provided with a plurality of first protruding portions 81 and at least one first screw hole is formed on each of the first protruding portions 81. Further, the inverter accommodating box 1 is provided with one first recess portion 82 and a plurality of second screw holes is formed on the first recess portion 82 or, alternatively, the inverter accommodating box 1 is provided with a plurality of first recess portions 82 and at least one second screw hole is formed on each of the first recess portions 82. The number, position, and shape of the second protruding portions 83 correspond to those of the first recess portions 82.

The number of the screws is also determined according to practical applications. Moreover, when other types of fasteners are used, the first screw hole and the second screw hole include other types of holes correspondingly. For example, when the fastener is a rivet, a first hole and a second hole are formed on the casing of the inverter accommodating box 1 and the junction box 2 correspondingly, the inner diameters of the first hole and the second hole match with the outer diameter of the rivet, and the inner walls of the first hole and the second hole are smooth. The rivet is inserted into the first hole and the second hole to fix the casing of the inverter accommodating box 1 with the casing of the junction box 2.

Therefore, since this embodiment is provided with an angle between the installation direction of the screw and the bottom surface, the operator can screw from the front conveniently and then compress the junction box 2 and the inverter accommodating box 1 tightly, so as to ensure the sealing state therebetween. Once the main body of the inverter circuit needs to be disassembled, the operator only needs to release the screw and separate the first quick connector 71 from the second quick connector 72, such that the main body of the inverter (i.e. the inverter accommodating box 1) is separated from the junction box 2. The embedded pluggable structure of the quick connector 7 further improves waterproof capability for the wire. Since the connection between the wire and the quick connector 7 is completed in the factory in advance, the operator only needs to plug and unplug the quick connector 7 to connect and disconnect the inner and outer wires.

As mentioned in the above, according to the inverter box structure of the present disclosure, it is convenient to assemble and disassemble the junction box and the inverter accommodating box by disposing the quick connectors in the junction box and the inverter accommodating box. Since the connection position between the outlet wires of the inverter circuit and the quick connector is fixed, the alignment of wire connection is not an issue while connecting the quick connectors with each other. Accordingly, the present disclosure can improve convenience of operation and achieve fool-proofing function and further reduce cost of assembly and maintenance. The present disclosure not only can be applied to the photovoltaic inverter, but also can be adapted to other types of inverters which can be widely used.

While the present disclosure has been described by way of example and in terms of the preferred embodiments, it is to be understood that the present disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An inverter box structure comprising an inverter accommodating box of an inverter circuit and a junction box; and
   a first quick connector being disposed on the inverter accommodating box, the first quick connector comprising a first connection end and a second connection end, the first connection end of the first quick connector being electrically coupled with the inverter circuit;
   a second quick connector being disposed on the junction box or in the junction box, the second quick connector comprising a third connection end and a fourth connection end, the third connection end of the second quick connector being connected with inner wires of the junction box;
   wherein a casing of the inverter accommodating box equipped with the first quick connector is connected with a casing of the junction box equipped with the second quick connector, and the second connection end of the first quick connector matches with and is electrically connected to the fourth connection end of the second quick connector;

the casing of the inverter accommodating box and the casing of the junction box are connected to each other by at least one fastener;

a first hole corresponding to the fastener is arranged on the casing of the junction box, a second hole corresponding to the first hole is formed on the casing of the inverter accommodating box, the second hole and the first hole are coaxial and through, the fastener is fixed in the first hole and the second hole to fix the casing of the inverter accommodating box and the casing of the junction box; a central axis of the first hole is tilt relative to a bottom surface of the junction box;

a first protruding portion is disposed at an inner surface of the casing of the junction box, the first hole is formed on the first protruding portion, and an end surface of the first hole is perpendicular to the central axis of the first hole;

a first recess portion is disposed at an outer surface of the casing of the inverter accommodating box, the second hole is formed on the first recess portion, and an end surface of the second hole is perpendicular to a central axis of the second hole;

a second protruding portion is disposed at an outer surface of the casing of the junction box, the second protruding portion corresponds to and matches with the first recess portion of the outer surface of the casing of the inverter accommodating box, and the second protruding portion is embedded in the first recess portion, and the fastener is locked in the first hole and the second hole to the connect and fix the inverter accommodating box and the junction box.

2. The inverter box structure of claim 1, wherein the second connection end of the first quick connector protrudes from the inverter accommodating box or the fourth connection end of the second quick connector protrudes from the junction box, the second connection end of the first quick connector and the fourth connection end of the second quick connector are embedded with and electrically connected with each other, and the casing of the inverter accommodating box is in contact with the casing of the junction box.

3. The inverter box structure of claim 2, wherein the first quick connector is a male connector and the second quick connector is a female connector or, alternatively, the first quick connector is a female connector and the second quick connector is a male connector.

4. The inverter box structure of claim 1, wherein the second quick connector is disposed in the junction box, the casing of the junction box has an opening corresponding to the first quick connector; the second connection end of the first quick connector passes through the opening to be electrically connected to the fourth connection end of the second quick connector.

5. The inverter box structure of claim 1, wherein the fastener is a bolt, a screw, or a rivet.

6. The inverter box structure of claim 1, wherein a tilt angle between the central axis of the first hole and the bottom surface of the junction box is greater than 50 degree and less than 70 degree.

7. The inverter box structure of claim 1, wherein only one first protruding portion is disposed at the inner surface of the casing of the junction box and a plurality of first holes are formed on the first protruding portion.

8. The inverter box structure of claim 1, wherein a plurality of first protruding portions are disposed at the inner surface of the casing of the junction box and at least one first hole is formed on each of the first protruding portions.

9. The inverter box structure of claim 1, wherein only one first recess portion is disposed at the outer surface of the casing of the inverter accommodating box and a plurality of second holes are formed on the first recess portion.

10. The inverter box structure of claim 1, wherein a plurality of first recess portions are disposed at the outer surface of the casing of the inverter accommodating box and at least one second hole is formed on each of the first recess portions.

11. The inverter box structure of claim 1, wherein a connection terminal is disposed in the junction box, and an end of the connection terminal is electrically connected to the second quick connector through inner wires, the other end of the connection terminal is electrically connected to external equipment through external wires.

* * * * *